United States Patent [19]
Hensel

[11] 4,004,923
[45] Jan. 25, 1977

[54] METHOD OF USING A TEST FILM TO MEASURE DEVELOPER ACTIVITY

[75] Inventor: Roy E. Hensel, Cranbury, N.J.

[73] Assignee: American Hoechst Corporation, Bridgewater, N.J.

[22] Filed: Jan. 14, 1975

[21] Appl. No.: 540,831

Related U.S. Application Data

[60] Continuation-in-part of Ser. No. 412,405, Nov. 2, 1973, abandoned, which is a division of Ser. No. 306,325, Nov. 13, 1972, abandoned.

[52] U.S. Cl. .................................. 96/27 R; 96/33; 96/48 R; 96/67; 96/36.3; 356/162
[51] Int. Cl.² ...................... G03C 5/04; G03F 7/02
[58] Field of Search ............ 96/33, 36.3, 48 R, 67, 96/68, 116, 27 R; 356/162

[56] References Cited

UNITED STATES PATENTS

| 3,210,188 | 10/1965 | Gorig | 96/116 |
| 3,393,618 | 7/1968 | Baker | 96/33 |
| 3,746,540 | 7/1973 | Rarey | 96/116 |

Primary Examiner—Edward C. Kimlin
Attorney, Agent, or Firm—James E. Bryan

[57] ABSTRACT

A method of controlling developer activity in the processing of photosensitized printing plates; comprising, exposing a photographic test film, comprising, a film adapted to pass substantial amounts of light through some portions thereof and substantially lesser amounts of light through other portions thereof, preferably transparent portions and opaque portions, and having a background area and a plurality of insets separated from one another and surrounded by and separated by the background area, the background area having a plurality of regularly spaced dots, having a relatively small total dot perimeter per unit area and a constant dot size and adapted to pass substantial amounts of light through said dots, separated by lines adapted to transmit substantially lesser amounts of light through said lines, each of the insets having a plurality of regularly spaced dots, having a larger total dot perimeter than the small dot perimeter and constant dot size and adapted to pass small amounts of light through said dots, separated by lines adapted to pass substantially larger amounts of light through said lines, and the dot sizes from one inset to another differ progressively in said plurality of insets, along with a film of the material to be reproduced by said plate; establishing an inset which blends into the background area on the reproduced test film configuration on said plate when a plate is developed with a fresh developer fluid; repeating the steps of exposure and developing for subsequent plates; and adding replenisher or a diluent for said developer fluid when an inset other than said established inset blends into the background area on the reproduced test film configuration on one of the subsequent plates.

6 Claims, 7 Drawing Figures

4,004,923

METHOD OF USING A TEST FILM TO MEASURE DEVELOPER ACTIVITY

CROSS-REFERENCES TO RELATED APPLICATIONS

The present application is a continuation-in-part of application Ser. No. 412,405, now abandoned, filed Nov. 2, 1973, which, in turn, is a division of application Ser. No. 306,325, now abandoned, filed Nov. 13, 1972, both by the present inventor.

BACKGROUND OF THE INVENTION

In the printing art, ink is applied to paper in the image or printed areas directly by contact with a printing plate or indirectly by intermediate transfer from a printing blanket which, in turn, is contacted by a printing plate. In any event, the inked image areas of the printed paper correspond to areas of the printing plate which carry ink while the blank unprinted areas of the paper correspond to areas of the plate which do not carry ink. The three main types of printing processes differ from one another on the basis of whether the ink is above, on or below the general surface from which it is applied. In the typographic, letterpress or relief process, the image areas or type are upraised above the general surface of the plate and the ink is applied to these upraised areas while no ink is present on the depressed general surface of the plate. In the planographic or lithographic process, the ink is on the plane of the surface of the plate, the inked or image areas of the plate being ink receptive (generally oleophilic) while the uninked or non-image areas are ink repellant (generally hydrophilic). In the intaglio process (including gravure) the ink is in depressed areas of the plate while no ink is present on the upraised general surface of the plate. See "Printing Ink Technology," Leonard Hill Limited, London, 1958, pp. 1 to 4.

The very nature of printing makes it impossible, in most cases, to print photographs as such since continuous tone cannot be produced on printing machines. Instead, the image is broken up by using a "cross-line screen." This screen is placed in front of a negative in a camera when the picture is photographed. A negative is obtained of equally or regularly spaced dark elements or dots separated by light areas or opaque elements or dots separated by transparent areas, or a positive is obtained of equally or regularly spaced light elements or dots separated by dark areas or transparent elements or dots separated by opaque areas. In any event, tonal effects or differences in tone are generally produced by varying the size of the elements or dots while maintaining an equal or regular spacing. The negative or positive can be printed down on the printing plate by exposing the plate to an appropriate light source through the negative or positive and etching or developing the plate to produce the elements or dots as raised or depressed areas or ink receptive or ink repellant areas. The ultimate paper print will then consist of an orderly array of equidistant, printed elements or dots which are small in the highlight areas but so large as to overlap in the dense areas. This "breaking-up" of a printed area is known as "half-tone" printing and produces a convincing visual or integrated optical density effect of tonal variations by virtue of changes in the element or dot sizes. The half-tone technique is used to print photographs in both the typographic and planographic processes. Newspaper half tones have about 80 dots to the linear inch, good quality illustrations have about 160 dots to the linear inch and half-tones as fine as 200 dots to the linear inch have occasionally been produced. While not referred to as half-tone printing, an analogous technique is used in printing photographs by the gravure (intaglio) process. In the gravure process, tonal effects are produced by varying the depth of etching of elements or dots, varying the size of elements or dots or both. Specifically, in rotogravure, etching of a copper base produces an assembly of square sunken cells of different depth for holding and delivering the ink. Paper prints from such plates excel in giving a good reproduction of the full tonal depth and detail of the original photograph. A magnifying glass reveals that the print is separated into squares of ink, and a super-imposed, unprinted cross-line screen covers the print, varying from 80 to 400 lines to the inch. See: Printing Ink Technology, supra, pp. 1 to 4 and pp. 302 – 303.

The above-mentioned arrangements of elements or dots used in printing photographs by half-tone or the like to produce a visual or integrated optical density effect of tonal variations are commonly referred to, by those skilled in the art, as "tints" and this terminology will be used in the present application.

The present invention is directed to a test strip for use in the preparation of printing surfaces or plates in which the surface or plate is coated with a photosensitive material which changes in character when light struck. The light struck areas may be photohardened or rendered soluble when struck by the light and either etched or developed, as appropriate, depending upon the coating and the type of plate being prepared. In preparing the plate for printing, again depending upon the nature of the coating, a negative or positive, consisting of patterns of dark and light or opaque and transparent areas corresponding to the configurations to be printed, is placed in contact with the photosensitive plate, the plate is then exposed to an appropriate source of light through the negative or positive and finally the plate is etched or developed. Specifically, in the photolithographic process, a light-hardened coating is disposed on the plate, the plate is exposed to light through a negative and the plate is processed or developed by dissolving away the unhardened areas with an appropriate developer solution. For purposes of simplification, further discussion herein will be confined to the photolithographic process. See Printing Ink Technology, supra, pp. 333 to 340.

In the lithographic art, when photosensitized printing plates are processed by hand, each plate is developed with a given amount of fresh developer. However, processing machines, for economic reasons, often use a tank of developer with a recirculation system. To maintain proper strength of the developer, replenisher usually must be added at certain intervals or at times the developer must be diluted. Primarily, replenishment recommendations are made based on the total square footage of plates processed. Such square footage recommendations are obviously quite inadequate due to aging of the developer, as a result of differences in the length of time that a developer is in the machine. Also, the average coverage of the image on the plate varies and, thus, the depletion rate of the developer varies. Other shop conditions further influence developer strength.

Variations in developer strength have the effect of either dissolving away too much or too little of the element or dot which carries the ink, thus resulting in a change in the size of the element or dot. Since half-tone printing of photographs depends upon variations in dot or element size to produce tonal effects or tint variations, such changes in element or dot size become quite critical and contribute to poor reproduction of the original.

Accordingly, in automatic processing, it is desirable to have an early warning device of some type, which will permit the operator to maintain constant developer activity in the processor regardless of individual conditions, in order to avoid wasting expensive plates.

In order to provide such an early warning device, all known existing test film targets were investigated to see if they would adequately serve the above purpose. In GATF Research Progress 69, "The GATF Dot Gain Scale" by Frank Preucil, Zenon Elyjiw and Robert F. Reed, published in November 1965, a dot gain scale designed for printing was described. This device was tested for purposes of determining its value as a test film target for monitoring developer activity and was found to have insufficient sensitivity to permit the operator to visually observe the result with the naked eye on the processed plate. Another device using a similar principle is the "Baker Signal Strip." The Baker Signal Strip is even less useful for purposes of monitoring developer activity than the GATF Dot Gain Scale. The Baker Signal Strip is used to detect dot gain but has only one sensitive area per target which can only give a yes or no answer. The Baker Signal Strip is described in Graphic Arts Monthly XXXVII No. 8, 1965, at page 126 by Eugene Bulinski. In the article, it is stated that "—a quick visual observation of the plate guide section does not give adequate judgement of the degree of gain."

It is therefore an object of the present invention to provide a test film target and a method of using the same. Specifically, the present invention provides a test film target to be used as a control guide for monitoring developer activity in automatic plate processors, to show dot size change in printing and dot size change in bi- and tri-metallic etching. Specifically, the control guide is in the form of a film which is laid-down or "stripped" on a border or other non-printing area of the negative or positive film, and exposed together with the original film to be reproduced on the photosensitized printing plate. Visual observation of the reproduced guide on the plate with the naked eye will permit readout of developer solution activity and provide a means for determining when replenisher must be added to the developer solution or a diluent for the developer fluid must be added long before any diminution or increase in the strength of the developer has any noticeable effect on the reproduction of the original film. As a matter of fact, the guide indicates developer solution activity to a degree which can be observed by the naked eye at normal viewing distances even though no visible change in the quality of the reproduced original can be observed by a 10 times magnifier.

BRIEF DESCRIPTION OF THE DRAWINGS

These and other objects and advantages will be apparent from the following description when read in conjunction with the drawings wherein.

SUMMARY OF THE INVENTION

A photographic test film comprising, a pattern of opaque elements or dots on a transparent base for monitoring chemical activity in plate processing machines, by monitoring element size changes on lithographic plate images produced from said pattern by contact exposure, in which the pattern or film is made up of two configurations of regularly spaced elements or dots of between 55 and 90% area coverage placed adjacent to one another for critical visual judgement with the unaided eye and such configurations are chosen on the basis of maximum and minimum practical total element perimeter per unit area, one configuration having uniform element or dot sizes of regular spacing and the other configuration having a progressive series of varying element or dot sizes of regular spacing and one configuration being capable of showing a large integrated optical density change for a specific image change and the other being capable of showing relatively little integrated optical density change for the same image change.

DETAILED DESCRIPTION OF THE INVENTION

The test film target of the present invention is designed to produce the maximum visual effect upon the human eye for any given incremental amount of image gain or growth on a printing plate. This has been accomplished in the present invention by utilizing two observations concerning the nature of element or dot patterns on photographic films and element or dot (image) gain or growth on printing plates.

Figure 2:
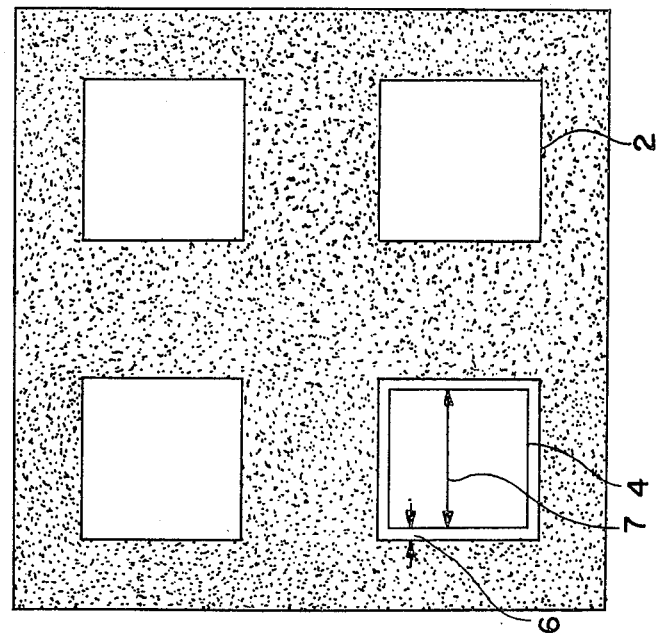
FIGS. 1 and 2 are 200 times enlargements of square dot printing patterns on a 100 line screen representing areas of contrasting optical density on a photographic film.
Figure 1:
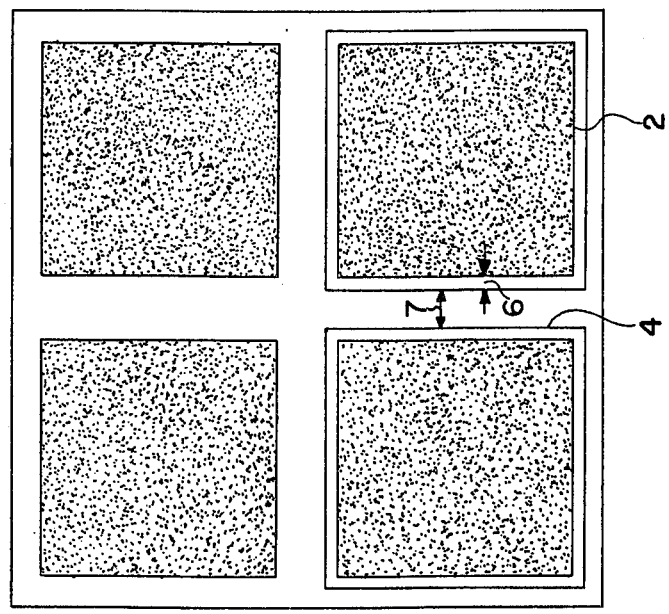

The first principle in the development of the test film of the present invention is that it has been found that the use of a transparent, relatively narrow width band to separate opaque elements or dots results in a much greater density change for a given increment of dot growth than if a fairly broad width opaque band were utilized to separate transparent dots. Referring to FIGS. 1 and 2 of the drawings, these figures are 200 times enlargements of dot patterns on photographic film showing such contrasting opaque and transparent areas. It is to be seen that both FIGS. 1 and 2 represent square dot areas 2 and that each combination of the drawings is of equal optical density. When compared to each other, the configuration of FIG. 1 will show a greater density change to the eye for a given degree of dot size change than will the configuration of FIG. 2. This is due to the fact that, although the linear increase 6 in printing area size from an original outline 2 of FIG. 1 to a new outline 4 is constant, both the interdot width as well as the printing area have changed to a greater degree than would be the case in FIG. 2. By contrast, in FIG. 2, the same linear dot change 6, while possibly apparent to the eye, would not be so dramatic visually. In fact, if dot growth were to continue in one more equal step, the distance 7 in FIG. 1 would become 0 causing the tint to become suddenly a solid black area, whereas the distance 7 in FIG. 2, while decreased, would still be finite. Accordingly, a much more striking and optically visible change tone or tint occurs when relatively narrow width bands are utilized to separate dots rather than the conventional situation where relatively small dots are separated by wide bands of tint area. Obviously, this same effect would be apparent on a plate or on a printed paper if the film were exposed in contact with a presensitized plate, and the plate developed, inked and put on a press. That is, size changes in elements or dots of the plate would produce the same visual effects.

Figure 3:
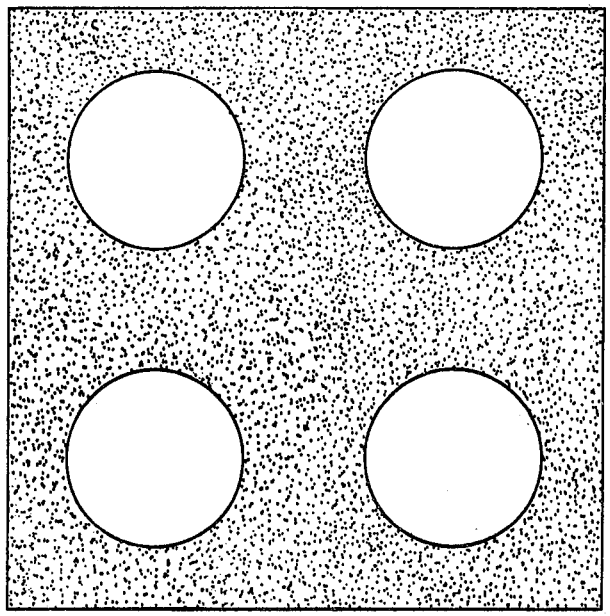
FIG. 3 is a 200 times enlargement of a conventional 70% round dot printing pattern on a 100 line screen representing areas of contrasting optical density on a photographic film.

The other factor involved in the selection of dot or element patterns and configurations, in accordance with the present invention, is that the larger the perimeter of the dots per unit area the greater will be the visual density change upon dot growth. This is illustrated by comparing FIGS. 2 and 3 of the drawings. FIG. 3 is a 200 times enlargement of a 70%, 100 line tint representing the most often used circular dot configuration. By contrast, FIG. 2 shows a square dot configuration which is also a 200 times enlargement of a 70%, 100 line tint. Comparing the square dot configuration of FIG. 2 as opposed to the round dot configuration of FIG. 3, the perimeter of the square dot of FIG. 2 is 1.12 times the perimeter of the round dot of FIG. 3. Consequently, when the square dot of FIG. 2 is used, it will be more sensitive to density changes as a function of image growth since, for any given image growth, the area of the square dot will decrease more than the area of the circle, thus causing a greater absolute density increase, which is naturally more apparent to the eye of the viewer.

Figure 4:
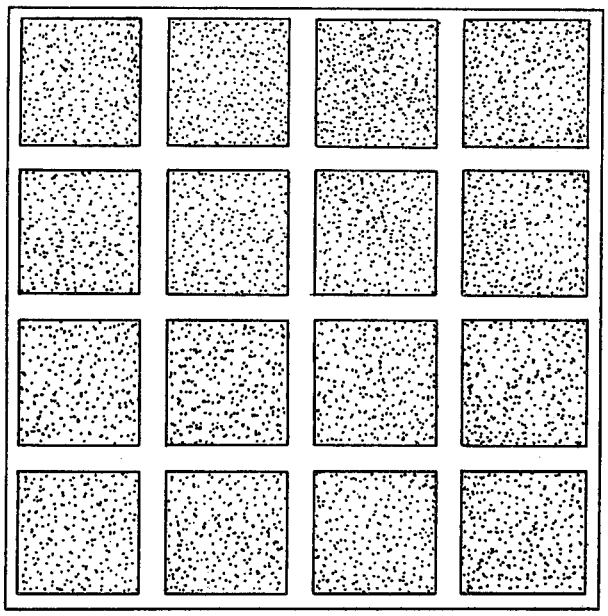
FIG. 4 is a 200 times enlargement of a square dot printing pattern on a 200 line screen representing a fine tint area of the present invention on a photographic film.

The total perimeter of all dots of a square dot configuration can be further increased for each tint value by going to finer line screens. This is shown in FIG. 4 of the drawings. FIG. 4 of the drawings shows a 200 times enlarged drawing of a 70%, 200 line screen. The tint, however, is of equal tonal value to the 100 line screen of FIG. 1, because the total opaque area is the same. As is evident, the total perimeter of all dots in FIG. 4 is greater than the total perimeter of all dots in FIG. 1 by a factor of just over 2.

Thus, both principles discussed above are combined and illustrated by the square dot pattern of FIG. 4 which represents one fine tint area, consisting of regularly spaced maximum perimeter opaque dots separated by narrow transparent bands, used in the present invention. This square dot pattern of FIG. 4 provides a fine tint area which exhibits large density changes as a result of minor dot gain or growth and, therefore, a pronounced visual effect or change of appearance of the fine tint area, if the same principles are followed to change the area of the opaque dots while maintaining equal dot spacing (center to center) and, of course, the same number of screen lines per inch.

Figure 5:
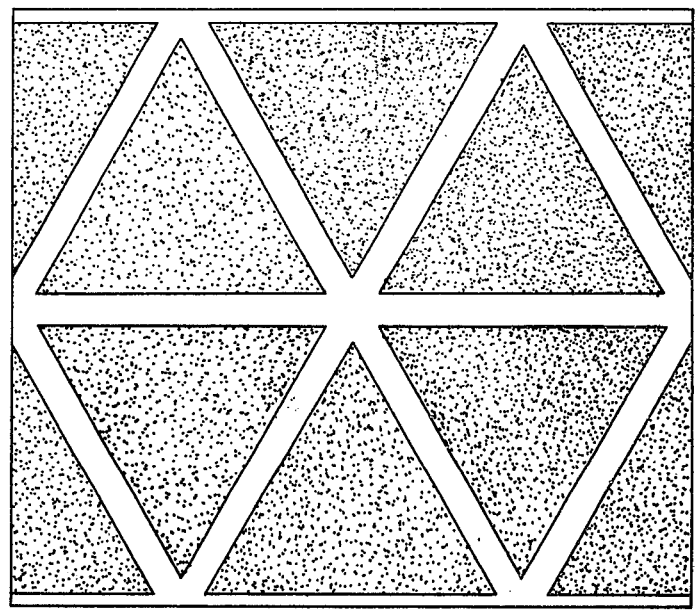
FIG. 5 is a 200 times enlargement of a printing pattern representing a fine tint area of the present invention on a photographic film.

FIG. 5 of the drawings shows another configuration which may be employed in making fine tint areas in accordance with the present invention. In accordance with FIG. 5, opaque, equilateral triangles are separated by relatively narrow width transparent bands.

While the square and triangular configurations of FIGS. 4 and 5 are preferred configurations, other geometric shapes may also be utilized to obtain maximum dot perimeter, such as, semicircles, with complementary adjacent shapes, and irregular shapes. Polygons, with a restricted number of sides, are also suitable. However, where the number of sides of a polygon increases to the extent that it approaches a round dot, then the value of such a configuration with narrow width bands between the dots is lost.

In addition to the above, the sensitivity to change and, thus, the increase in density and the visual effect to the naked eye of dot patterns is greater when the printing area of the fine tints is greater than 50% and, preferably, between about 55 and 90%.

Figure 6:
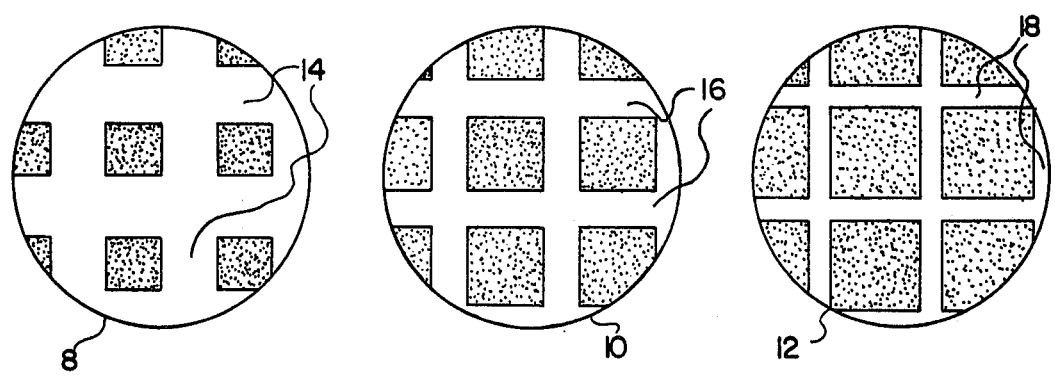
FIG. 6 is a series of fine tint areas in accordance with the present invention showing progressive optical density variations of consecutive fine tint areas.

The fine tints previously discussed can therefore be utilized to indicate very small changes in dot growth by altering the optical density of fine tint areas in a progressive fashion. For any of the printing element configurations, this can be accomplished by progressively changing the average band width separating the dots in the fine tint configurations of FIGS. 4 and 5 while maintaining the center to center spacing or number of lines per inch constant. For a square dot type guide, this is illustrated in FIG. 6 of the drawings. In accordance with FIG. 6, the circles 8, 10 and 12 represent progressively narrower band widths between the dots of a dot configuration such as that shown in FIG. 4. It will be seen that, progressing from left to right through circles 8 through 12, the band width 14 of circle 8 is larger than the band width 16 of circle 10 which, in turn, is larger than the band width 18 of circle 12. Accordingly, these progressive, fine tint configurations can be utilized and the band widths selected to give the desired sensitivity to be accomplished by the test film.

Figure 7:
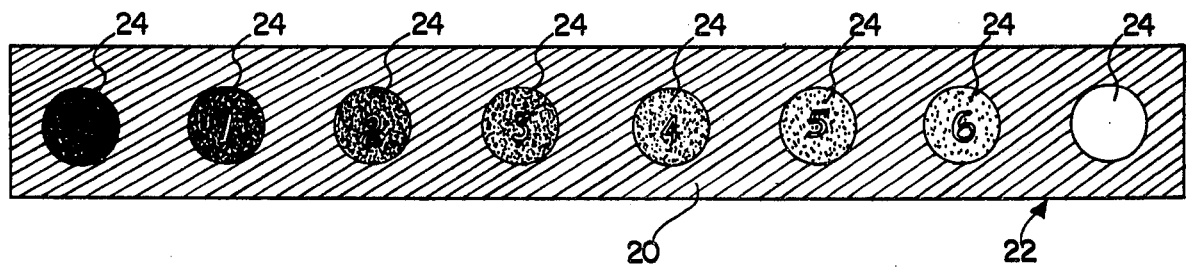
FIG. 7 is a representation of a 2 times enlargement of one configuration of a positive test film of the present invention as well as a print made on a negative-working photosensitive coating from a negative test film of said configuration of the present invention.

As is apparent from the previous discussion of dot configurations and the factors which make the configurations of FIGS. 4 and 5 highly sensitive as compared with the configuration of FIGS. 2 or 3, it will be evident that a dot configuration showing the least change in density or visual acuity as a result of dot growth or gain is the configuration of FIG. 3. Consequently, by combining on a test film the configuration of FIG. 3 (minimum perimeter transparent dots separated by opaque bands) as a background and the configurations of FIGS. 4 and 5 (maximum perimeter opaque dots separated by transparent bands), in a progressively changing manner as shown in FIG. 6, a test strip can be produced which is highly sensitive and readily observed by the human eye without the necessity of any optical devices, such as, a 10 times magnifier. Such a test film is illustrated in FIG. 7 of the drawings, which represents a positive film or the print-out of a negative film on a printing plate. According to FIG. 7, the background area 20 of the film strip 22 is designed for the least possible change in density due to image growth or reduction. A configuration such as that of FIG. 3 of the drawings meets these requirements. Specifically, a 100 line per inch round dot screen resulting in a 70% tint on the plate was found to be most desirable. Although less perimeter would have resulted from a choice of 65 or 85 line screen dots, these dots would have been so coarse as to be resolved individually, with normal vision at normal reading distances, and would not integrate satisfactorily as a tone. The 100 line tint area was found to change very little with plate developer strength changes, which is a basic requirement for a background for the film of the present invention. Included within the background 20 of the strip 22 are the circular fine tint areas 24. As was previously discussed, these circular fine tint areas change in band width progressively and in optical density from left to right. As may be seen from FIG. 7, there are eight such fine tint areas 24 formed on the strip 22. The background area of the actual guide will generally measure about ½ inch by 4 inches and the eight fine tint areas 24 will be about ¼ inch circles of 200 line per inch tints as described above, and these tints will, in essence, be composed of crossed bands. The width of each band increases in a progressive manner from the circle 24 on the left to the circle 24 on the right. Six of the circles are numbered sequentially while one unnumbered circle is located at either end of the strip. Since each of the fine tint circles 24 have different band widths, one of the circles will match the background in integrated optical density or tonal effect and therefore blend together with it. When exposure and development are optimum, the test film will usually blend at the circle numbered 2. The exact time to replenish or dilute developer in the printing plant may vary from plant to plant depending upon operating conditions and quality standards. In general, taking the situation where circle 2 normally blends with the background, when a circle numbered 2 appears dark on a properly exposed plate while the circle numbered 3 blends in with the background 20 or is somewhat lighter than the background, replenisher should be added to the developing fluid. If sufficient replenisher is added, the circle numbered 2 will once again blend into the background 20 on subsequently processed plates. The circle 24, designated number 2, was chosen as the "normal" circle for matching because, in practice, the tendency is to move to the higher numbers as the developer fluid loses its potency. A move toward lower numbers is a rarity which means that additional numbers below the circle numbered 2 would seldom, if ever, be used. However, the lower numbered circle does indicate when it is necessary to add a diluent to a developer fluid which is too strong. The unnumbered circles at either end of the film strip will probably never blend with the background. Their main function is to assure that at least one circle is always lighter and one is always darker than the background. This helps in locating the matching circle. Evaluation is made by normal viewing with the unaided eye. Good lighting conditions for viewing are desirable but not essential. The operation of the guide of this invention will be made clearer by the following description of the use of the film in maintaining developer activity in an automatic plate processor. References are to a film strip as illustrated in FIG. 7.

The test film of the present invention can be used as an aid in maintaining constant developer strength in an automatic plate processor. It is used in conjunction with a Stouffer scale and in the same manner. See *Chemistry of Lithography*, by Paul J. Hartsuch, Lithographic Technology Foundation, Inc., New York, N. Y., pp. 121 through 123 and 128 through 133 and *How to Make and Run Better Aluminum Surface Plates*, by Jack W. White, Lithographic Technology Foundation, Inc., New York, N. Y., pp. 22 to 29. When the guide and the Stouffer scale are stripped on the plate in contact with the plate, and in the same manner as the film of the matter to be printed, and are exposed and developed on a plate, the Stouffer scale will give an indication of exposure optimization while the test film of the present invention will indicate the activity of the developer. On the processed plate, some circles will appear lighter than the background while others will appear darker. At some point, the density of one of the circles and the background will match causing them to blend. The number of this circle should be noted by the operator. As the developer becomes weaker, the number of the matching circle will move toward the larger numbers, that is, from left to right. The number will change before a change in a conventional halftone image can be seen on the plate.

At proper exposure, experience has shown that the number 2 circle usually matches the background when a plate is processed with fresh developer of proper strength, although, individual printing plants may choose other conditions to meet specific requirements, which, in turn, will cause a different circle to match with the background. When the numbered circle matching the background is one full number above that obtained with fresh developer in the system, it is time to add replenisher. Replenisher, in small increments, should be added, until the guide is at or near the normal matching number (usually number 2). The guide numbers and the Stouffer scale numbers, as well as the quantity of replenisher added, should be recorded for future reference.

While the above description utilizes a test film background of transparent, minimum perimeter round dots separated by opaque bands and a series of insets made up of opaque, maximum perimeter square dots separated by transparent bands in which the total area of the square dots change progressively from one inset of the series to the other (equivalent to a change in band width) while maintaining a constant number of lines (bands) or regular dot spacing for all insets, this arrangement can be reversed. Specifically, the background of the test film can be made up of opaque, maximum perimeter square dots separated by transparent bands and the series of insets can be made up of transparent, minimum perimeter round dots separated by opaque bands in which the total area of the round dots change progressively from one inset in the series to the other while maintaining a constant number of lines for all insets. Obviously, since the integrated optical density of the arrangement of opaque, maximum perimeter dots changes more for changes in dot size or band width than the arrangement of transparent, minimum perimeter dots, the former are preferred for the series of insets. It is also obvious, as previously stated, that the contrasting light transmission through the film can be accomplished by dark versus light as well as opaque versus transparent.

Since the film strip of the present invention is a device of very high and controllable sensitivity, it is also useful in other applications involving dot size change. For example, in bimetallic plate preparation, it is necessary, after exposure and development, to etch the copper layer with an acid etch, typically, an iron chloride solution. A major problem in the control of the process is to prevent copper dots from being overetched with consequent dot size reduction. This can be readily accomplished with an appropriately designed film strip, in accordance with the present invention. Similarly, dot size changes in printing may be monitored with a film strip employing the principle of the present invention.

The following examples illustrate the method of the present invention.

The following procedure was used to make the test strip used in the examples. The square dot tints of 200 lines per inch were specially made. First, a number of 200 lines per inch straight line negatives of various line widths were made by normal photographic means. Negative pairs of equal line width were crossed at right angles and contact printed to produce flat tints in positive form (black squares with clear lines as they would be reproduced in the guides on the plates). A large number of these square dot tints were made of varying square dot sizes. From these, the tints to be used were selected by densitometry at intervals of 0.04 integrated optical density difference from 0.52 to 0.32. One tint for each end of the guide, to be used in the unnumbered circles, was also selected. The tint selected for the unnumbered circles preceding the number 1 circle was simply a tint which should always reproduce as darker than the reference tint (background of the strip). This makes the visual judgement easier and at times can supply additional proof of weak developer when it appears almost solid on the plate. The unnumbered circle beyond circle 6 is a reverse tint (dark lines and clear squares in positive form). This circle should never appear darker than the reference tint. The prime use of this tint is for quality control in manufacture. In negative form, this is the only area with sufficient integrated optical density to provide highly accurate densitometer measurements. The eight selected tints were positioned on a mask which had an opaque background and clear circles. This combination was exposed by contact on a piece of ordinary graphic arts contact film in a vacuum frame with a point light source. This was the first of a 3-part exposure on one film.

Another mask exactly opposite of the mask used to expose the square dot tints was used to expose the 100 line per inch circular screen tint. This tint had clear round dots on opaque 70% area. This was the second exposure.

A third exposure on the same contact film was then made to put numbers inside the circles. Registration of the three exposures was achieved with a punch and pin system.

After the third exposure, the film was processed in a lower than normal contrast developer (DuPont 24D) to gain maximum resolution. The developed result was a master negative with:
1. A series of 8 circles, each composed of a plurality of 200 line per inch square dots, each with a different integrated optical density.
2. A reference tint, around the 8 circles, composed of 100 line per inch round dots.
3. Opaque numbers within 6 of the circles.

The master negative was then used to contact a multiple master positive with a punch and pin register system. At this time, the wording above and below the guide was added by a separate contact exposure.

This is only one of a number of methods which can be used to produce the patterned test film of this invention. Other materials could also be used. Materials and methods are unimportant as long as the final result is a pattern which conforms to the requirements set forth in this application. The pattern has been produced by photographic means but any other means to achieve the identical result would produce a control guide of equal utility. A human with eyes like an eagle, nerves of steel, a hand steady as a rock, and with the patience of Job, could draw one on a clear base with India ink.

EXAMPLE 1

An ENCO N-50 presensitized negative working plate, as manufactured by AZOPLATE Division of American Hoechst Corporation, was exposed in a Nu-Arc Model FT 40M Platemaker with a carbon arc light source in contact with and under a negative composed of halftone (150 line screen) and line work. A test film of the present invention was stripped or placed in the nonprinting area. After exposure of 60 seconds, the plate was developed in the Encomatic Plate Processor (supplied by Azoplate Division), fully charged with a fresh supply of the standard developer supplied by manufacturer. The developed plate was examined and found to be normal and satisfactory. Examination of the developed area of the plate where the film strip was exposed showed that the Number 2 circle blended with the background. Additional plates were developed in the processor until the control guide on a plate, exposed as before, showed to the unaided eye that the Number 3 circle blended with the background. Careful examination of halftones and linework revealed no difference from the first plate developed, even when viewed with a 10 times magnifier, proving that the new control film strip is more sensitive to change than the conventional image areas. At this point, 16 oz. (1 pint) of developer replenisher solution, as supplied by the manufacturer, was added to the reservoir tank of the processing machine and carefully mixed to assure homogeneity. Next, a fresh plate was exposed and developed as before. The control guide on the developed plate showed the Number 2 circle again blended into the background. As before, there was no ascertainable difference in the dot structure or appearance of the principle halftone and line image of the plate.

EXAMPLE 2

The test, as in Example 1, was repeated, except that many more plates were processed over a period of time, which resulted in loss of developer strength by depletion and by evaporation. The control guide as it appeared on the plate developed last, now showed the fine tint circle No. 6 to blend with the background. On this plate, it was easily seen, in the principle image, that the 150 line halftones had filled in areas due to low developer strength, although some of the line work would have been acceptable. With the addition of 16 ounces of replenisher, the matching number moved to the Number 3 circle and the 150 line halftones appeared satisfactory in a quick visual examination. With the addition of 16 more ounces of replenisher, for a total of 1 quart, the matching number moved back to the Number 2 circle. Thus, the machine processing capability was restored.

It will be obvious to those skilled in the art that many modifications may be made within the scope of the present invention without departing from the spirit thereof, and the invention includes all such modifications.

What is claimed is:

1. A method of controlling developer activity in the processing of photosensitized printing plates comprising exposing a presensitized printing plate to a test pattern together with a film of material to be reproduced by said plate, said test pattern being composed of two configurations of regularly spaced elements of between about 55 and 90 percent area coverage, placed adjacent to one another for critical visual judgement with the unaided eye, one of said configurations being a background and the other configuration being a foreground, said configurations being selected on the basis of larger and smaller practical total element perimeter per unit area with the configurations of larger total element perimeter being polygonal, the background configuration having uniform element sizes of regular spacing and the other configuration having a progressive series of varying element sizes of regular spacing, the configuration of the foreground being capable of showing a large integrated optical density change for a specific image change and the background being capable of showing relatively little integrated optical density change for the same image change, developing said plate with fresh developer fluid, selecting visually a region of the foreground which matches the integrated optical density of the background area on the reproduced test pattern on said plate, repeating said steps of exposing and developing for subsequent plates, and adding replenisher or a diluent for said developer fluid when a foreground area other than said selected foreground region blends into said background area on the reproduced test pattern configuration on one of said subsequently exposed and developed plates.

2. A method according to claim 1 wherein the configurations of smaller total perimeter are round dots.

3. A method according to claim 1 wherein the configurations of larger total perimeter are square dots.

4. A method according to claim 1 wherein the configuration of larger total perimeter are triangular dots.

5. A method according to claim 1 wherein the pattern is a negative film adapted to be exposed on a negative subtractive lithographic plate.

6. A method according to claim 1 wherein the pattern is a positive film adapted to be exposed on a positive subtractive lithographic plate.

* * * * *